United States Patent [19]

Kinbara

[11] Patent Number: 4,594,650
[45] Date of Patent: Jun. 10, 1986

[54] INVERTER DEVICE

[75] Inventor: Yoshihide Kinbara, Aichi, Japan

[73] Assignee: Mitsubishi Denki Kabushiki Kaisha, Tokyo, Japan

[21] Appl. No.: 598,779

[22] Filed: Apr. 11, 1984

[30] Foreign Application Priority Data

Apr. 19, 1983 [JP] Japan ............................ 58-68674
Aug. 1, 1983 [JP] Japan ........................... 58-140794

[51] Int. Cl.$^4$ .......................................... H02H 7/122
[52] U.S. Cl. ...................................... 363/58; 361/111; 363/132
[58] Field of Search ................. 363/55, 56, 58, 98, 363/132; 323/908; 361/58, 91, 110, 111

[56] References Cited

U.S. PATENT DOCUMENTS

| | | | |
|---|---|---|---|
| 3,465,207 | 9/1969 | Merdian, Jr. | 361/92 |
| 3,474,322 | 10/1969 | King | 363/136 |
| 4,232,235 | 11/1980 | Faust et al. | 361/91 |
| 4,301,496 | 11/1981 | Schwarz | 363/17 |
| 4,399,499 | 8/1983 | Butcher et al. | 363/17 |

FOREIGN PATENT DOCUMENTS 2632381  1/1978  Fed. Rep. of Germany .
2909435  9/1980  Fed. Rep. of Germany .
3237220  5/1983  Fed. Rep. of Germany .
588788   6/1977  Sweden .

OTHER PUBLICATIONS

ETZ Bd 100 (1979), vol. 13, pp. 664–670, Andreas Boehringer and Helmut Knoll, "Transistorschalter im Bereich hoher . . . " (with translation).
Elektrie 6, (1968), pp. 236–238, E. Habiger, "Storschutzmittel zur Bedampfung induktiver Abschaltuberspannungen" (no translation).

Primary Examiner—Peter S. Wong
Assistant Examiner—Judson H. Jones
Attorney, Agent, or Firm—Sughrue, Mion, Zinn, Macpeak, and Seas

[57] ABSTRACT

An inverter device using semiconductor current control elements is disclosed in which a parallel circuit of a current limiting circuit composed of a reactor and a voltage spike absorbing circuit composed of a series circuit of a constant voltage element and a diode is connected in series with each of the semiconductor current control elements to prevent excess current flow through the latter.

11 Claims, 46 Drawing Figures

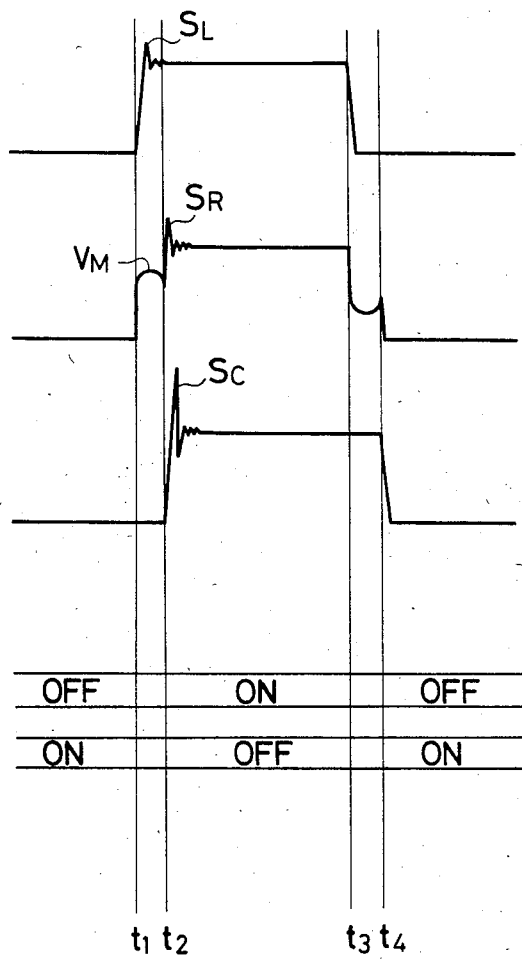

FIG. 5
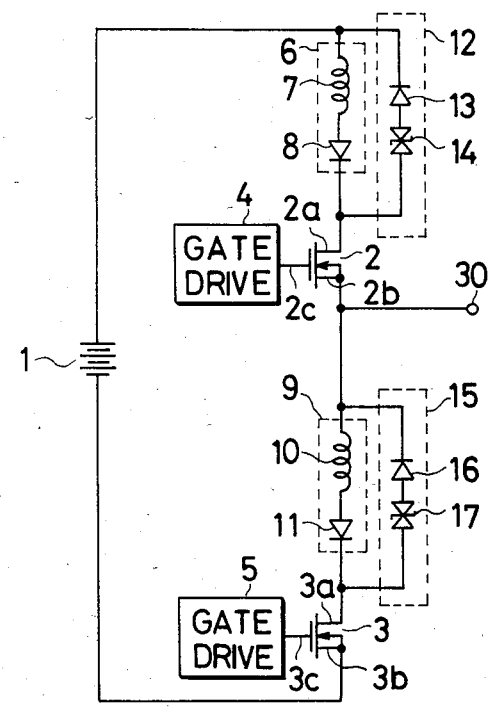
FIG. 6A
FIG. 6B
FIG. 6C
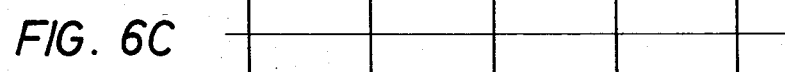
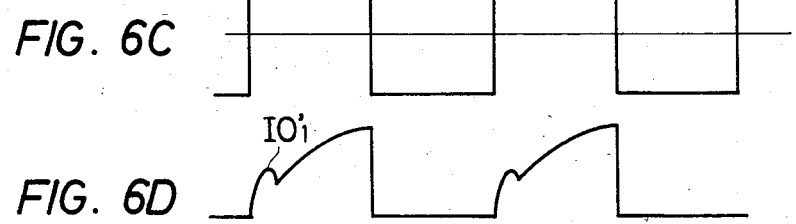
FIG. 6D
FIG. 6E
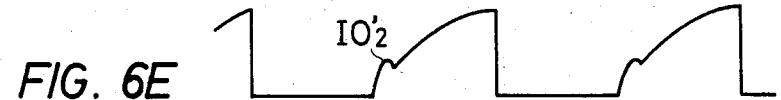
FIG. 6F
FIG. 6G
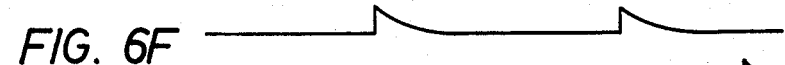

FIG. 20
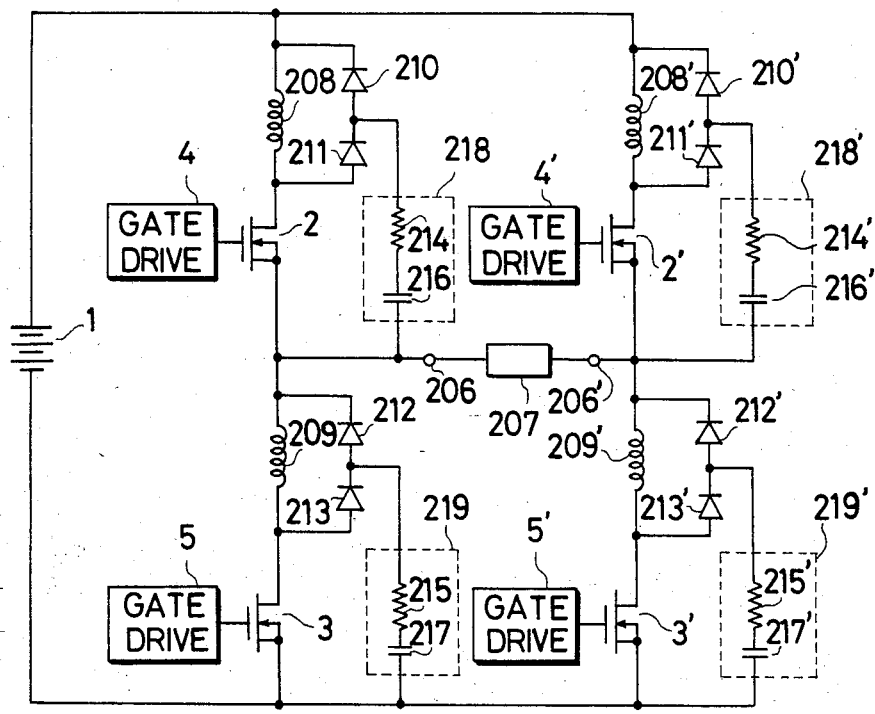
FIG. 21A  FIG. 21C
   FIG. 21B  FIG. 21D
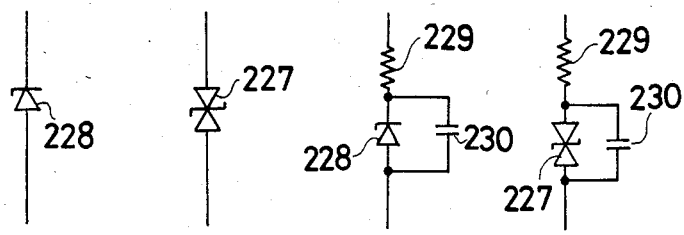

INVERTER DEVICE

BACKGROUND OF THE INVENTION

The present invention relates to an inverter device. More particularly, the invention relates to an inverter device employing semiconductor current control elements.

FIG. 1 shows a typical example of a conventional inverter device of the same general type to which the invention pertains. The device includes a first field effect transistor (MOSFET) 2 having a drain 2a connected to a positive terminal of a power source 1 and a source 2b connected to a drain 3a of a second MOSFET 3, the source 3b of which is connected to a negative terminal of the power source 1 to form a closed circuit. Gates 2c and 3c of the first and second MOSFETs 2 and 3 are connected to gate drive circuits 4 and 5, respectively. In FIG. 1, reference numeral 30 indicates an output terminal of the device.

When the first and second MOSFETs 2 and 3 are used as switching elements, an equivalent circuit of the device is as shown as in FIG. 2, in which there are capacitances $C_1$, $C_2$ and $C_3$ present between the drain 2a and the gate 2c, between the gate 2c and the source 2b and between the drain 2a and the source 2b, respectively. A resistor R, which appears when the first MOSFET 2 is turned on, is connected in series with a switch SW which is controlled by a voltage between the source 21 and the gate 2c. Further, the circuit includes a diode D connected in the reverse direction between the drain 2a and the source 2b. SITs (Static induction transistors) or junction-type field effect transistors etc. may be used instead of MOSFETs.

In operation, when the first MOSFET 2 is turned on upon reception of an output of the gate drive circuit 4, the potential at the output terminal 30 becomes equal to a potential $V^+$ of the power source 1. Then, when the first MOSFET 2 is turned off and the second MOSFET 3 is turned on upon reception of an output of the gate drive circuit 5, the potential at the output terminal 30 changes from $V+$ to $V^{31}$. That is, the voltage between the drain 3a and the source 3b of the second MOSFET 3 changes from $V^+$ to 0 and the voltage between the drain 2a and the source 2b of the first MOSFET 2 increases to $V^+$ abruptly.

FIGS. 3A through 3G taken collectively a timing chart describing the operation of the device of FIG. 1, of which FIG. 3A shows the switching state of the first MOSFET 2 and FIG. 3B that of the second MOSFET 3. FIG. 3C shows the potential at the output terminal 30, FIG. 3D the drain current of the first MOSFET 2, FIG. 3E the drain current of the second MOSFET 3, FIG. 3F the voltage between the source 2b and the gate 2c of the first MOSFET 2, and FIG. 3G the voltage between the source 3b and the gate 3c of the second MOSFET 3.

As can be seen from the waveform of FIG. 3E a current spike $IO_2$ is produced by the current flowing through the electrostatic capacitances $C_1$ to $C_3$ in FIG. 2 when the second MOSFET 3 is turned on. A current spike $IO_2$ is also produced when the first MOSFET 2 is turned on, as shown by FIG. 3D. Due to the current spikes $IO_2$ and $IO_1$, voltage drops $V_1$ and $V_2$ are produced across the capacitance $C_2$ as shown by the waveforms of FIGS. 3F and 3G, respectively. When the voltage drops $V_1$ and $V_2$ reach threshold voltages $V_{+h1}$ and $V_{+h2}$ of the first and second MOSFETs 2 and 3, the switch SW in FIG. 2 is switched on to provide a time period during which both the first and second MOSFETs 2 and 3 are conductive, resulting in a chort circuiting of the power source 1.

In the conventional inverter using the first and second MOSFETs 2 and 3 and constructed as above, when one of the FETs is turned on, current spike occurs which causes the other FET, then in the nonconductive state, to be turned on, thereby shortcircuiting the power source 1. Accordingly, the MOSFETs and the power source 1 may be damaged.

FIGS. 4A through 4C show waveforms of the voltage between the drain 3a and the source 3b of the second MOSFET 3 with a load connected to the output terminal 30 being inductive, resistive and capacitive, respectively, and FIGS. 4D and 4E show corresponding operational states (on and off) of the first and second MOSFETs 2 and 3, respectively.

The MOSFETs 2 and 3 are switched between on and off states by the output signal of the gate drive circuits 4 and 5, respectively. For example, when the FETs are supplied with output signals such that the first and second MOSFETs 2 and 3 are turned off and on, respectively, the potential at the output terminal 30 becomes that ($V^-$) of the negative terminal of the power source 1, whereupon a current I flows through a load connected to the output terminal 30.

If the load is inductive, when the second MOSFET 3 is turned off at a time instant $t_1$, a current $I_2$ designated in FIG. 1 continues to flow through the load due to the fact that a current tends to flow in the same direction as that just before turn-off, and thus the potential at the output terminal 30 becomes $V^+$. A surge voltage $S_L$ is very small in this case (see FIG. 4A). There may be substantially no surge voltage produced when the MOSFET 2 is turned on at a time instant $t_2$ since the potential at the output terminal 30 is then at the potential of the positive terminal of the power source.

If the load is resistive, when the MOSFET 3 is turned on at the time instant $t_1$, the potential at the output terminal 30 becomes $V_M$, which is between $V^+$ and $V^-$. Then, when the MOSFET 2 is turned on at $t_2$, the potential at the output terminal 30 increases abruptly. Since the shift of the MOSFET 2 to the on state is performed at a very high speed, a surge voltage $S_R$ is produced due to an oscillation of an oscillation circuit composed of a distributed inductance and stray capacitance of the circuit wiring and the electrostatic capacitances of the MOSFET etc. (see FIG. 4B).

If the load is capacitive, when the MOSFET 3 is turned off at $t_1$, the potential at the output terminal 30 does not change substantially. Then, when the MOSFET 2 is turned on at $t_2$, the potential at the output terminal at the output terminal 30 increases abruptly. Particularly, a surge voltage $S_c$ produced in this case is higher than that $S_R$ in the case of a resistive load because of a higher voltage increase rate $dV/dt$ due to the high switching speed of the MOSFET.

As mentioned above, the surge voltage produced in the conventional inverter is very high, and if it is higher than the breakdown voltage of the MOSFET, the latter may be destroyed. Thus, it has been difficult to construct an inverter using high voltage MOSFETs having high switching speeds.

SUMMARY OF THE INVENTION

An object of the present invention is to provide a semiconductor inverter device in which the current spikes through semiconductor current control elements are restricted in amplitude and a stable high speed switching is realized.

In order to achieve the above object, a parallel circuit of a current limiting circuit and a current spike absorbing circuit is inserted into a current path of an inverter using, as current control elements, semiconductor current control elements such as field effect transistors.

Another object of the present invention is to provide an inverter device of high efficiency in which a surge voltage of current control elements is minimized by connecting a reactor, a diode and a voltage spike absorbing circuit to the current control elements.

This object is achieved by connecting, in series to each of the current control elements, a parallel circuit of a reactor and a series connection of a pair of diodes and connecting, in parallel with each series connection of one of the series diodes and one of the current control elements associated therewith, a voltage spike absorbing circuit.

BRIEF DESCRIPTION OF THE DRAWINGS

FIGS. 3A through 3G and 4A through 4E show current and voltage waveforms at various points in the circuit shown in FIG. 1;

FIG. 5 is a circuit diagram showing a first embodiment of the present invention;

FIGS. 6A through 6G show current and voltage waveform at various points in the circuit of FIG. 5;

FIG. 20 shows a nineth embodiment of the present invention; and

FIG. 21 is a circuit diagram of an example of a voltage spike absorbing circuit.

DESCRIPTION OF THE PREFERRED EMBODIMENTS

Figure 1:
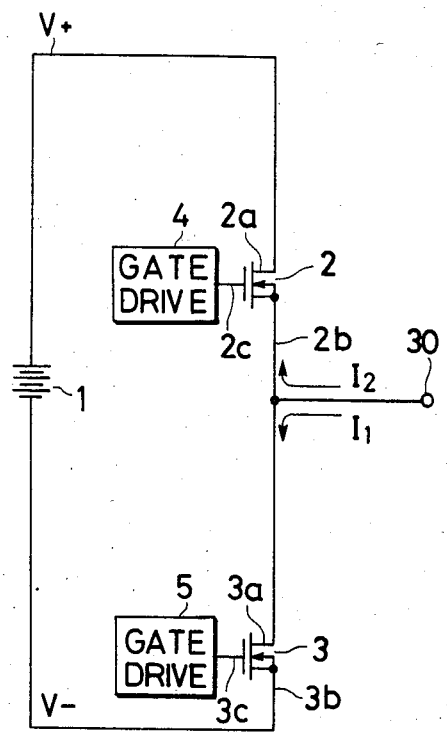
FIG. 1 is a circuit diagram of a typical example of a conventional inverter device.

FIG. 5 shows a circuit diagram of a first embodiment of the present invention in which same or similar circuit elements are depicted by the same reference numerals as those used in FIG. 1.

In FIG. 5, a current limiting circuit 6 is inserted between a drain 2a of a first MOSFET 2 and a power source 1 and a current limiting circuit 9 is inserted between a drain 3a of a second MOSFET 3 and a source 2b of the first MOSFET 2. The current limiting circuit 6 is constituted by a series connection of a reactor 7 and a diode 8, and the circuit 9 is constituted with a series connection of a reactor 10 and a diode 11. Voltage spikes absorbing circuits 12 and 15 are also connected in parallel with the current limiting circuits 6 and 9, respectively. The voltage spike absorbing circuit 12 includes a series connection of a diode 13 and a constant voltage element 14, and the circuit 15 includes a series connection of a diode 16 and a constant voltage element 17.

Figure 3A:
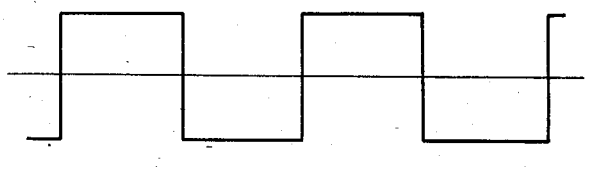
Figure 3C:
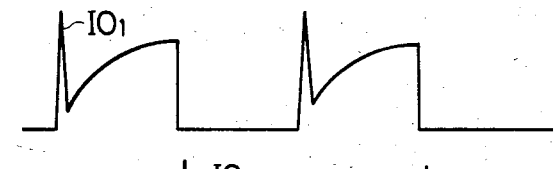
Figure 3D:
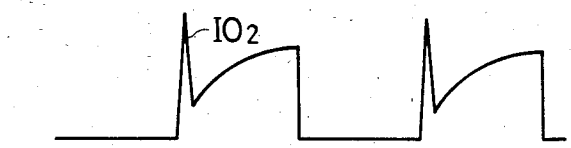
Figure 3E:
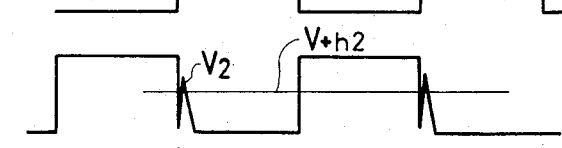
Figure 3F:
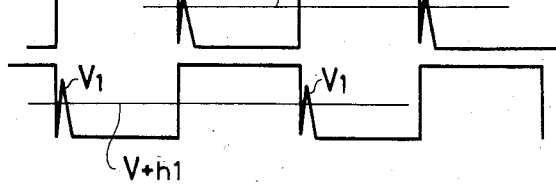

FIGS. 6A through 6G show current and voltage waveforms at various points of the circuit in FIG. 5, in which FIGS. 6A to 6C are waveforms similar to those of FIGS. 3A to 3C, respectively, and FIGS. 6F and 6G are voltage waveforms in the voltage spikes absorbing circuits 12 and 15, respectively.

In the circuit construction of FIG. 5, drain currents of the first and second MOSFETs 2 and 3 are limited by the reactors 7 and 10 and current spikes $IO_1'$ and $IO_2'$ corresponding thereto are very small, as shown by the waveforms of FIGS. 6D and 6E, respectively. In this case, it is possible to obtain the current limiting effect even if the load connected to an output terminal 30 is capacitive. Therefore, when the first and second MOSFETs 2 and 3 are turned off, the voltage spike absorbing circuits 12 and 15 reduce the voltages appearing across the reactors 7 and 10 as shown by the waveforms of FIGS. 6F and 6G respectively, and hence generation of voltage spikes due to currents flowing through the reactors 7 and 10 is prevented.

The diodes 8 and 11 of the current limiting circuits 6 and 9 function to prevent current flowing from the sources of the MOSFETs 2 and 3 to the drains thereof from flowing through the reactors 7 and 10 and to restrict the direction of currents in the reactors to one direction. Thus, resonances of the circuits composed of the electrostatic capacitances distributed between the drains and the sources of the first and second MOSFETs 2 and 3 and the reactors 7 and 10, when the MOSFETs are switched, are prevented from occurring, thereby prevent generation of voltage spikes.

The diodes 13 and 16 of the voltage spike absorbing circuits 12 and 15 may be of the high speed switching type and the constant voltage elements 14 and 17 thereof may be Zener diodes, varistors, diodes, etc.

It is possible to use a series circuit of a diode and a resistor as the voltage spike absorbing circuit. In such case, however, the voltage reduction thereby may be delayed due to an inductance of the resistor itself. To the contrary, since the series connection of the semiconductor rectifier elements is inherently non-inductive, the circuit construction in FIG. 5 may be preferable in view of the delay and the cost of such diodes, which are inexpensive compared with resistors.

Figure 7:
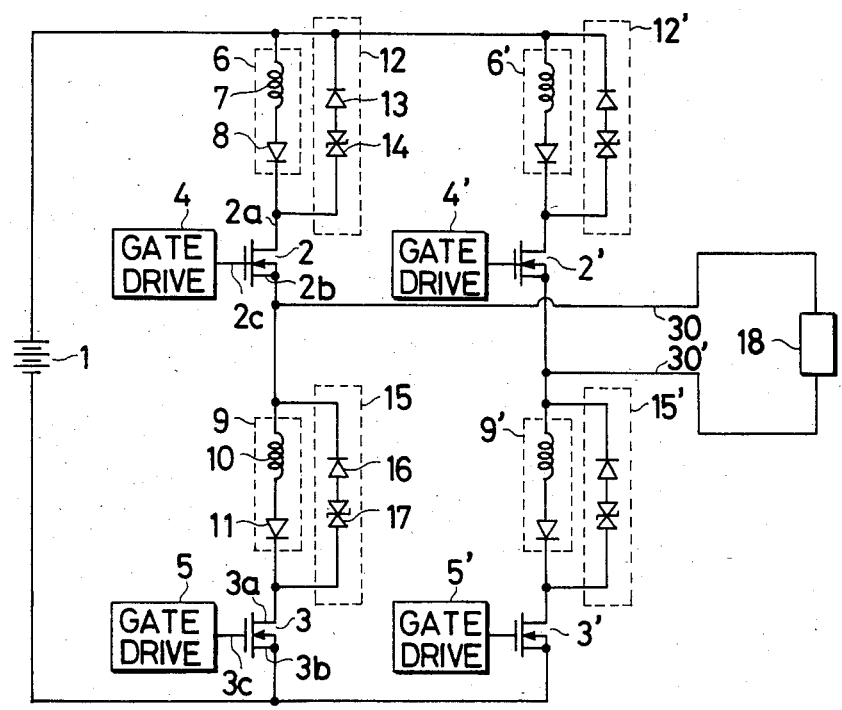
FIGS. 7, 8 and 9 are circuit diagram showing second, third and fourth embodiments of the present invention, respectively.

FIG. 7 shows a second embodiment of the present invention which is a single phase inverter and includes, in addition to the series-connected first and second MOSFETs 2 and 3 and the various elements associated therewith in FIG. 5, a series connection of third and fourth MOSFETs 2' and 3' connected in parallel with the series-connected first and second MOSFETs. The MOSFETs 2' and 3' are associated with current limiting circuits 6' and 9' and voltage spikes absorbing circuits 12' and 15', which have the same constructions as those associated with the MOSFETs 2 and 3 in FIG. 5, respectively. The elements associated with the MOSFETs 2' and 3' are depicted by the same reference numerals as those used in FIG. 5 with primes suffixed thereto. A load 18 is connected between the output terminal 30 and another output terminal 30'.

Figure 2:
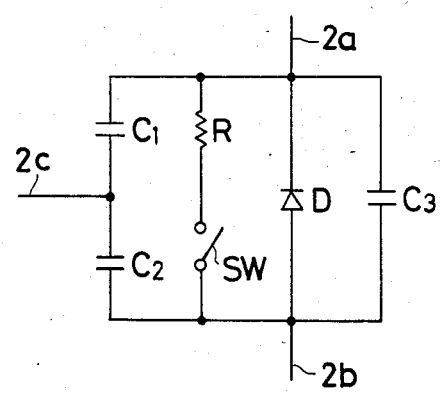
FIG. 2 is an equivalent circuit of a MOSFET.

With this embodiment, an inverter output voltage across the load can be twice as high as that in the first embodiment. In a case where the load 18 is inductive, reverse voltages may be applied the respective MOSFETs 2, 3, 2' and 3'. However, due to the presence of the reverse diodes D (FIG. 2) of the respective MOSFETs and the voltage spike absorbing circuits 12, 15, 12' and 15', the MOSFETs are not subjected to breakdown. In the MOSFET-type inverter, there is no need of diodes to be connected in parallel and in opposite directions to active elements, which are necessary in the conventional inverter using transistors to prevent such reverse voltage application.

Figure 8:
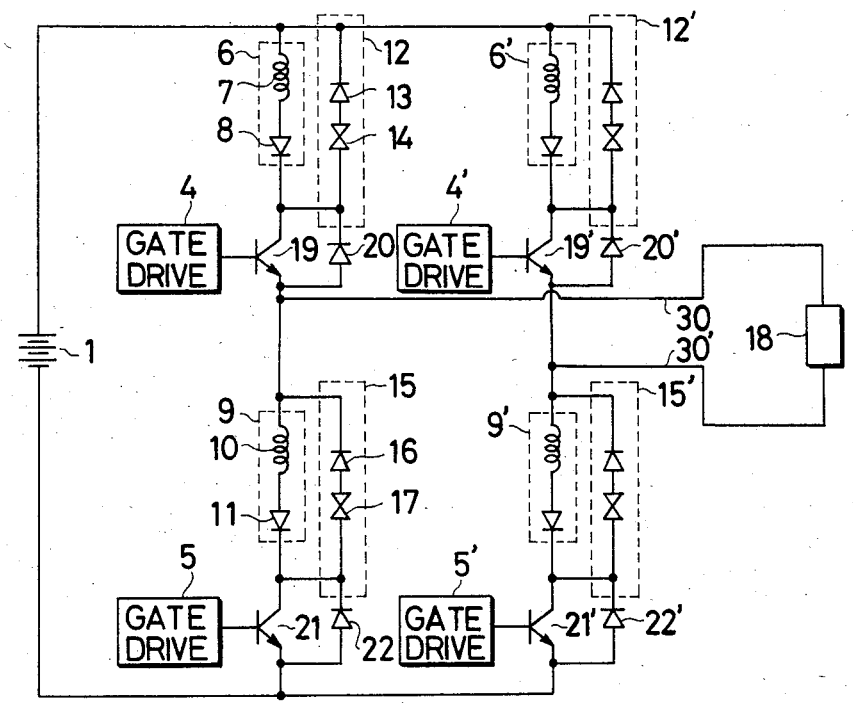

FIG. 8 shows a third embodiment of the present invention in which the MOSFETs 2, 3, 2' and 3' of the second embodiment are replaced by parallel-connected transistor-diode pairs 19 and 20, 21 and 22, 19' and 20', and 21' and 22', respectively.

Figure 9:
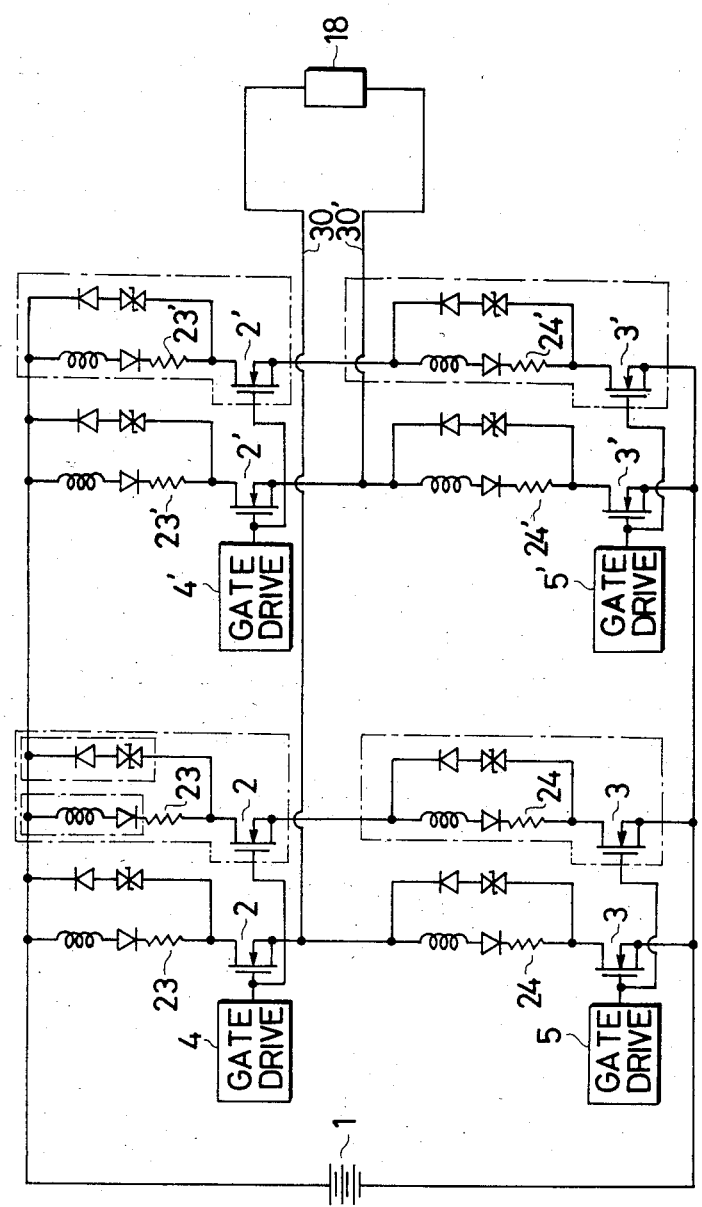

FIG. 9 shows a fourth embodiment in which each of the parallel-connected MOSFET circuits includes a pair of the series-connected MOSFETs shown in FIG. 7 and is provided with a parallel circuit composed of the same elements as those constituting the MOSFET circuit. In this embodiment, since the on-resistance R in the equivalent circuit of the MOSFET shown in FIG. 2 varies between the respective MOSFETs 2, 3, 2' and 3' and it is impossible to obtain the same current flowing therethrough when connected in parallel, current balancing resistors 23, 24, 23' and 24' are connected in series with the current limiting circuits 6, 9, 6' and 9' of the drain circuits of the MOSFETs, respectively. Values of the current balancing resistors 23, 24, 23' and 24' are on the order of that of the on-resistance R of the MOSFETs 2, 3, 2' and 3', respectively, generally, about 0.1 to 1 ohm.

It is possible to constitute the current balancing resistors 23, 24, 23' and 24' by winding resistive wires such as nickel-chrome, stainless steel or copper-nickel wires on the reactors 7, 10, 7' and 10', respectively.

It is clear for those skilled in the art that the single-phase inverter shown in FIG. 9 can be easily modified to a three-phase or multi-phase inverter by merely increasing the number of the series connections of two MOSFETs.

Figure 10:
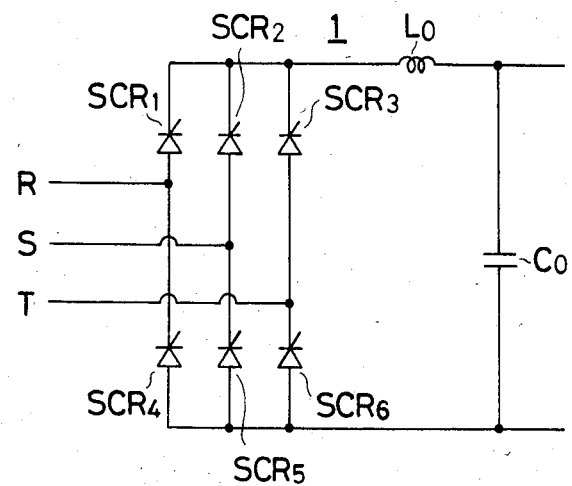
FIG. 10 shows a circuit diagram of a power source used in any of the above embodiments of the present invention.

FIG. 10 shows an example of the power source 1 used in the respective embodiments mentioned before. The power source 1 in FIG. 10 includes three parallel-connected series pairs of silicon controlled rectifiers $SCR_1$ to $SCR_6$, a reactor $L_0$ connected in series with the parallel-connected series SCR pairs, and a capacitor $C_0$. Three phase AC voltages R, S and T are phase controlled by the rectifiers $SCR_1$ to $SCR_6$ and a constant DC voltage is obtained across the capacitor $C_0$.

Figure 11:
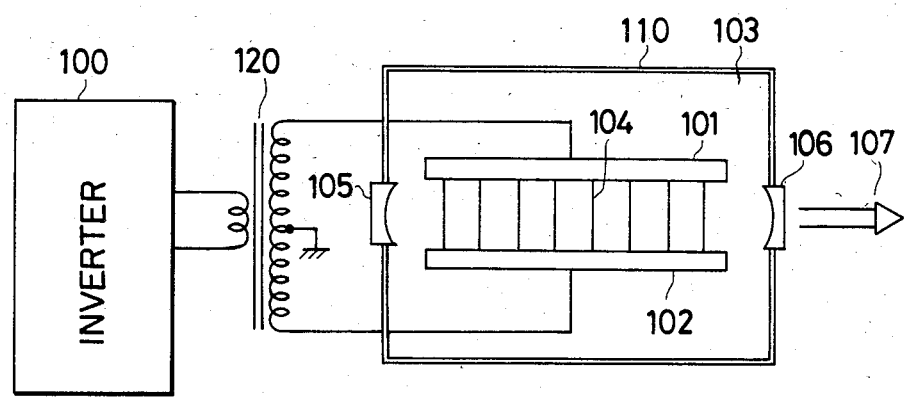
FIG. 11 is a circuit diagram of a silent discharge excited laser oscillator using the power source shown in FIG. 10.

FIG. 11 shows an application of the present inverter device 100 of the MOSFET type to a silent discharge power source for a silent discharge excited laser oscillator 110. An output of the inverter device 100 is amplified by a step-up transformer 120 and supplied between electrodes 101 and 102, which are covered by inductive members. The silent discharge excited laser oscillator 110 is filled with a laser medium gas 103. When a silent discharge (104) occurs between the electrodes 101 and 102, laser oscillation occurs between a full mirror 105 and a half-silvered mirror 106, resulting in the generation of laser light 107. When an inverter device is used as the power source in such an application, the output frequency of the power source must ordinarily be 50 KHz to 200 KHz. Such a high output frequency cannot be realized with transistors or thyristors, but can with MOSFETs.

With the inverter of the present invention featured by a parallel connection of a current limiting circuit and a voltage spike absorbing circuit inserted into a main current path of the semiconductor current controlling element, it is possible to prevent current spikes from flowing through the semiconductor element. As a result, there is no short circuiting of the power source due to turn-on of one of semiconductors which is supposed to be turned off. Therefore, damage to the power source and/or the semiconductor current control element is avoided and a stable switching operation at high frequencies without parasitic oscillation is obtained.

Figure 12:
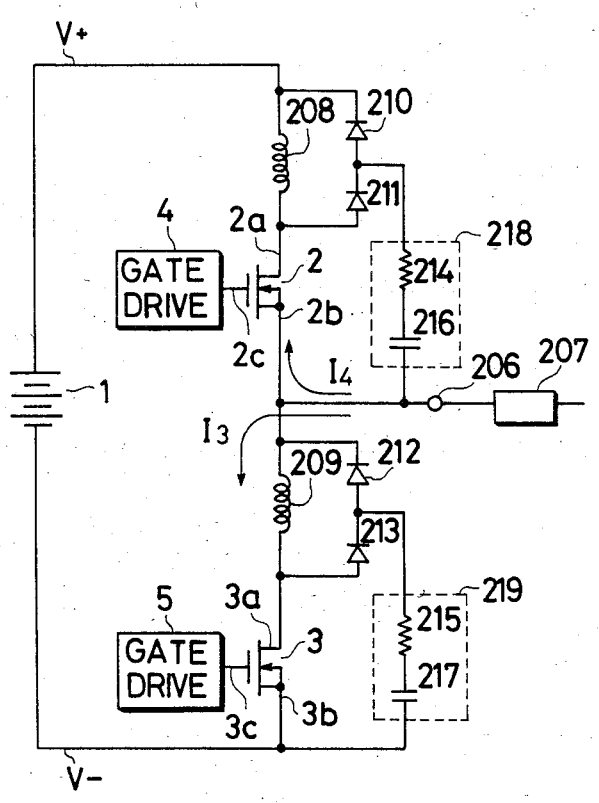
FIG. 12 is a circuit diagram showing a fifth embodiment of the present invention.

FIG. 12 shows another embodiment of the present invention, which is composed of MOSFETs 2 and 3, reactors 208 and 209 connected in series with the MOSFETs 2 and 3, respectively, series-connected diode circuits 210 and 211, and 212 and 213 connected in parallel with the reactors 208 and 209, respectively, and voltage spike absorbing circuits 218 and 219 connected between junctions of the series-connected diodes and the gate electrodes 2b and 3b of the respective MOSFETs. The voltage spike absorbing circuit 218 is composed of a series circuit of a resistor 214 and a capacitor 216 and, similarly, the voltage spike absorbing circuit 219 is composed of a resistor 215 and a capacitor 217.

Figure 13:
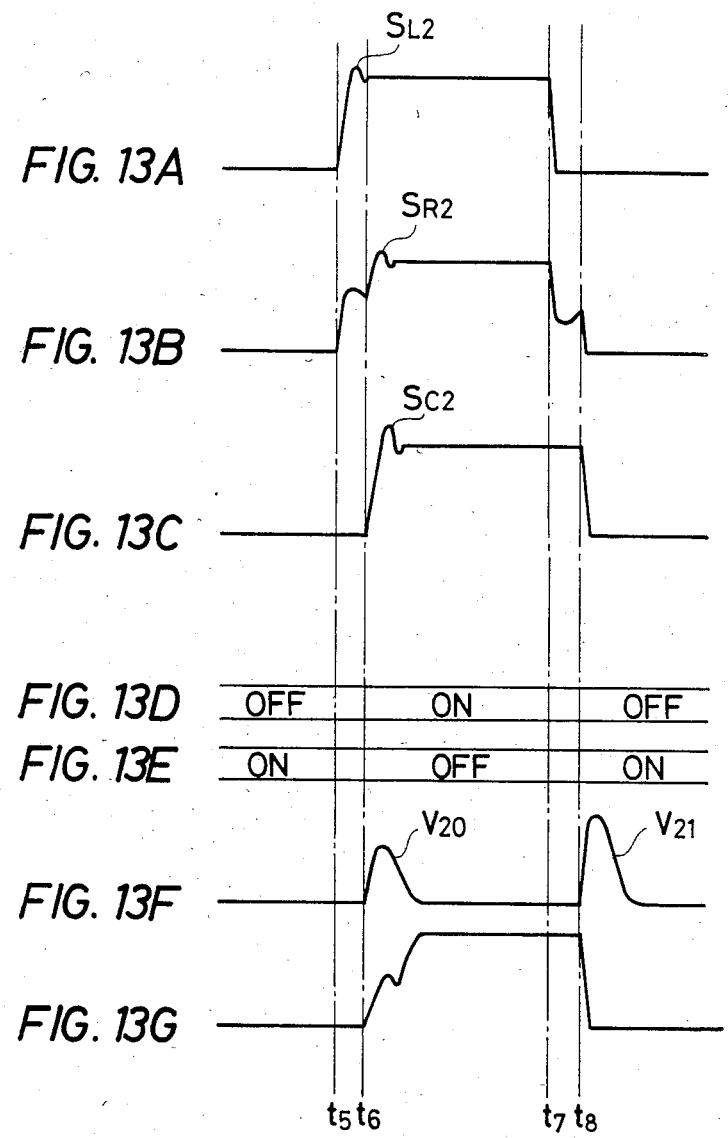
FIGS. 13A through 13G show current and voltage waveforms at various points in the circuit in FIG. 12.

FIGS. 13A through 13C show voltage waveform between the drain 3a and the source 3b of the MOSFET 3 in FIG. 12, which are similar to the waveforms of FIGS. 4A through 4C. The operational status of the MOSFETs 2 and 3 are indicated in FIGS. 13D and 13E, respectively.

With reference to FIGS. 13A through 13E, during a time period before a time instant $t_5$ in which the MOSFET 2 is in the nonconductive state and the MOSFET 2 is in the conductive state. The potential at an output terminal 206 is at the potential $V^-$ of the negative terminal of the power source 1. When a load 207 is connected, a current $I_3$ flows therethrough, as indicated in FIG. 12, in a way similar to the conventional device.

Figure 14:
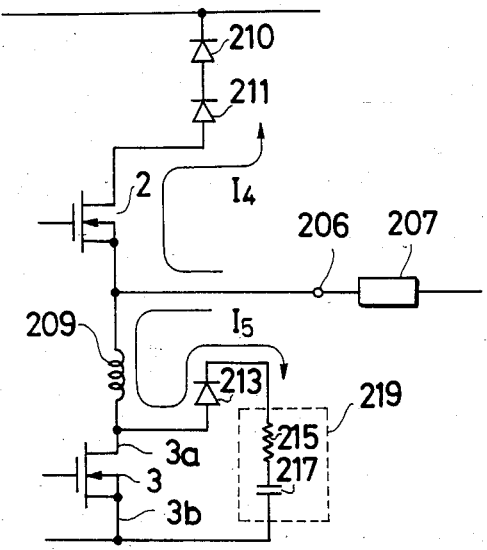
FIGS. 14, 15 and 16 are circuit diagrams of a main portion of the circuit in FIG. 12.

FIG. 13A shows the case where the load is inductive. Assuming that the MOSFET 3 is turned off at $t_5$ under the conditions as mentioned above, a current $I_4$ (indicated in FIG. 12) flows due to the fact that the current flowing through the load tends to continue to flow in the same direction. The current $I_4$ passes through the reverse diodes 210 and 211 associated with the MOSFET 2 as shown in FIG. 14, which shows a main portion of the circuit in FIG. 12 in detail. Therefore, the potential at the output terminal 206 increases to $V^+$, which is the potential at the positive terminal of the power source 1, during a time period $t_5$ to $t_6$ as shown by the waveform of FIG. 13A. With the increase of the potential at the output terminal 206, a current $I_5$ flows through the reactor 209, the diode 213, the resistor 215 and the capacitor 217 as indicated in FIG. 14. As a result, a voltage component derived from a voltage divider composed of the reactor 209, the diode 213, the resistor 215 and the capacitor 217 is added to the voltage between the drain 3a and the source 3b of the MOS- FET 3 so that an increase of the voltage is restricted during the time $t_5$ to $t_6$. Thus, the surge voltage $S_{L2}$ is reduced compared with the conventional device.

Figure 15:
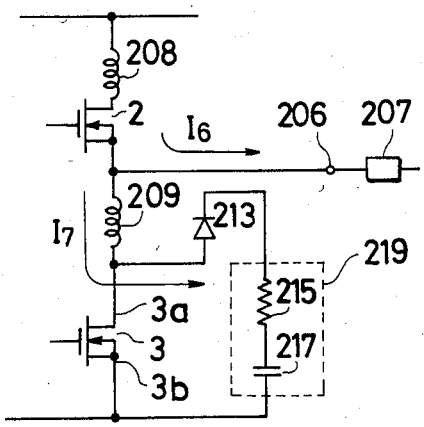

FIGS. 13B and 13C illustrate cases when the load 207 is resistive and capacitive, respectively. Assuming that the MOSFET 3 is turned off at $t_5$ and then the MOSFET 2 is turned on at a $t_6$, a current $I_6$ flows through the reactor 208 and the MOSFET 2 as indicated in FIG. 15 (which shows important portions of the circuit in FIG. 12 in detail). At that time, potential at the output terminal 206 rises to V+, supplying current to the load 207. However, the reactor 208 restricts the increase of the current and hence the increase of the output terminal voltage is delayed. Upon the increase of the potential at the output terminal 206, a current $I_7$ flows as shown in FIG. 15, and a voltage component derived from a voltage divider composed of the reactor 209, the diode 213, the resistor 215 and the capacitor 217 is added to the voltage between the drain $3a$ and the source $3b$ of the MOS 3, to reduce the surge voltages $S_{R2}$ and $S_{C2}$, as shown by the FIGS. 13B and 13C, respectively. Further, the generation of a current spike through the MOSFET 2 when it is turned on at $t_6$ is prevented since the capacitor 216 of the voltage spike absorbing circuit 218 is discharged through a closed loop composed of the resitor 216, the diode 210, the reactor 208, the MOSFET 2 and the capacitor 216 as a current $I_8$ indicated in FIG. 16.

As mentioned above, according to the present invention, voltage spikes are restricted to an acceptable low value irrespective of the nature of the load, that is, inductive, resistive or capacitive, since such are limited by the reactor and the voltage spike absorbing circuit, even if the switching speed of the MOSFET is very high. Further, the increase of the voltage between the drain $3a$ and the source $3b$ of the MOSFET 3 when the latter is turned off is restricted by the reactor 209 and the voltage spike absorbing circuit 219, and the increase of the drain current of the MOSFET 2 when the latter is turned on is restricted by the reactor 208. Therefore, the switching losses of the MOSFETs 2 and 3 are very low and the efficiency of the overall circuit much improved.

Figure 16:
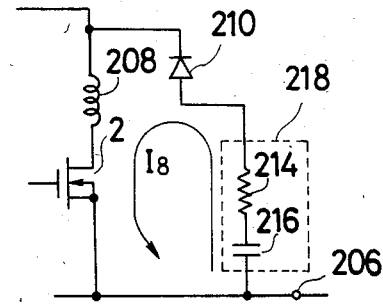

Instead of the series connection of the two diodes constituting the voltage spike absorbing circuit, it is possible to use a series cicuit of a diode and a resistor. In such a case, however, there is no current flow as shown in FIGS. 14 to 16, and a main current may flow through the resistor to a MOSFET, causing the circuit losses to increase. With the use of the diode-diode connection according to the present invention, such a problem does not occur.

Figure 17:
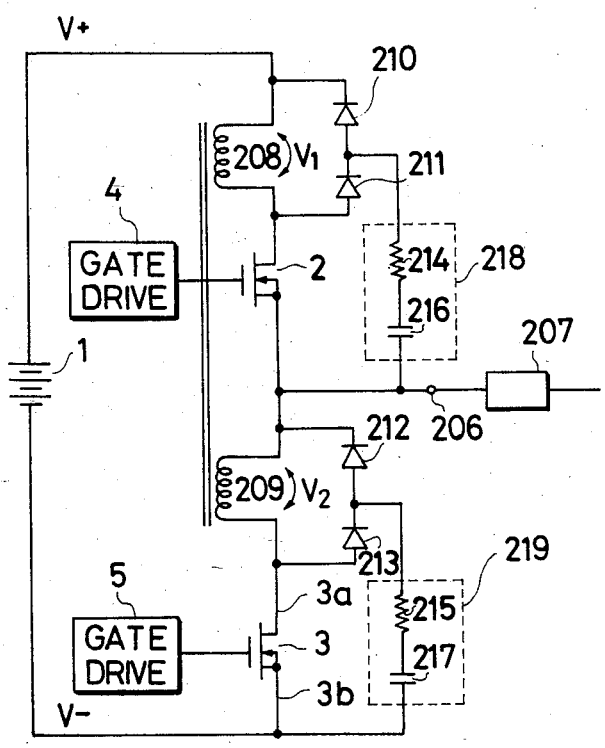
FIG. 17 is a circuit diagram of a sixth embodiment of the present invention.

FIG. 17 shows another embodiment of the present invention, in which the reactors 208 and 209 are coupled magnetically.

Assuming that the MOSFET 2 is in the conductive state during the time period $t_5$ to $t_6$ in FIGS. 13A to 13G, a curent flows through the reactor 208 to the load 207 and a voltage $V_1$ is produced across the reactor 208 when the current increases. Since the reactor 209 in magnetically coupled to the reactor 208, a voltage $V_2$ (FIG. 17) having a portion such as $V_{20}$ in FIG. 13F is produced across the reactor 209, causing the voltage across the drain $3a$ and source $3b$ of the MOSFET 3 to be lowered.

The timing of generation of the voltage $V_2$ is the same as that of the surge voltage $S_{R2}$ or $S_{C2}$ in FIGS. 13B or 13C. That is, the surge voltage is produced while the voltage between the drain $3a$ and the source $3b$ of the MOSFET 3 is lowered by the voltage $V_2$ across the reactor 209. Thus, the surge voltage can be restricted to a very small value, as shown by FIG. 13G.

When the MOSFET 3 is turned on after a time instant $t_8$, a current flows through the reactor 209 to the load 207 and a voltage $V_{21}$ such as shown by FIG. 13F is produced, as in the case of the MOSFET 2, causing the surge voltage of the MOSFET 2 to be lowered in this time period.

Figure 18:
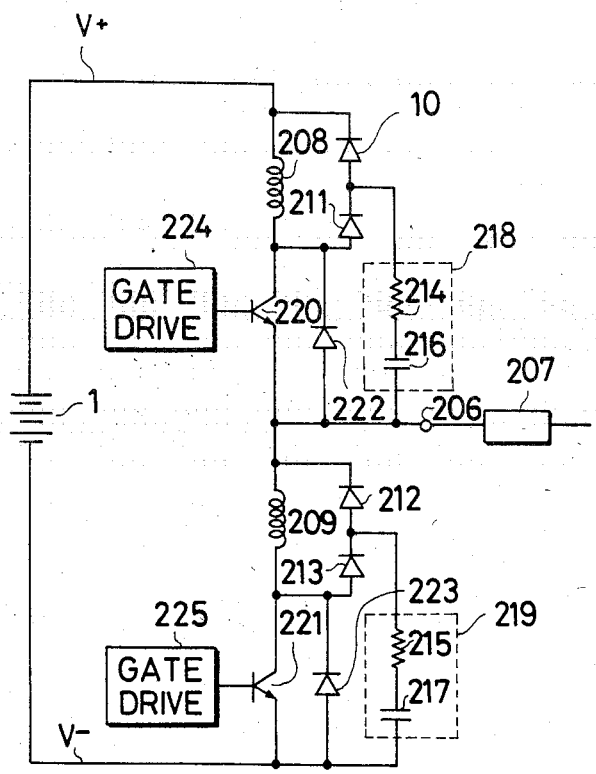
FIG. 18 is a circuit diagram of a seventh embodiment of the present invention.

FIG. 18 shows another embodiment of the present invention in which transistors 220 and 221 are used instead of the MOSFETs 2 and 3, respectively. As shown in FIG. 18, bases of these transistors are connected to base-drive circuits 224 and 225, respectively. The MOSFET itself has a diode component allowing current to flow from a source to a drain thereof. Since a transistor has no such diode component, diodes 222 and 223 have to be connected between collector-emitter circuits of the transistors 220 and 221, respectively. This embodiment functions in a manner similar to that of the inverter using MOSFETs. SIT or GTO (gate-turn-off) thyristor, etc. may be used as the current control element with substantially the same effects as those obtained using MOSFETs.

Figure 19:
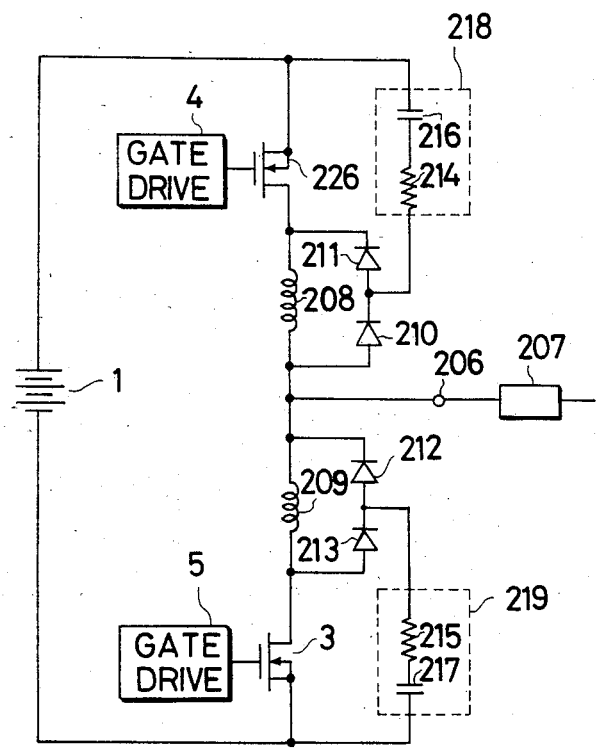
FIG. 19 shows an eighth embodiment of the present invention.

FIG. 19 shows another embodiment in which the N-channel MOSFET 2 in the embodiment in FIG. 12 is replaced by a P-channel MOSFET 26. The effects obtained with this embodiment are similar to those obtained by the previously described embodiments.

FIG. 20 shows still another embodiment in which a single-phase inverter is constituted with a pair of inverters according to the present invention.

It is, of course, possible to constitute a three-phase inverter or a multi-phase inverter by using three or more inverters according to the present invention. Further, the voltage spike absorbing circuit may be constituted by a Zener diode 228, a varistor 227, a combination of a resistor 229, a Zener diode 228 and capacitor 230, or a combination of a resistor 229, a varistor 227 and a capacitor 230, etc. as shown by FIGS. 21A through 21D, respectively, with similar effects as mentioned hereinbefore.

I claim:

1. An inverter device comprising: a DC power source, a pair of series-connected current control elements, said series-connected current control elements being connected in series with said DC power source so that a load connected to a junction between said current control elements is supplied with an output voltage by switching said current control elements alternatively, a pair of parallel circuits each comprising a pair of series-connected diodes and a reactor connected in parallel with said series-connected diodes and said reactor being connected in series with a respective one of said current control elements, and a pair of voltage spike absorbing circuits, each of said voltage spike absorbing circuits being connected in parallel with a circuit including one of said series-connected diodes and a respective one of said current control elements.

2. The inverter as claimed in claim 1, wherein each said voltage spike absorbing circuit comprises a resistor and a capacitor connected in series with said resistor.

3. The inverter as claimed in claim 2, wherein said voltage spike absorbing circuit further comprises at least one of a diode and a Zener diode connected in parallel with said capacitor.

4. The inverter as claimed in claim 1, wherein each said current control element comprises a field effect transistor.

5. The inverter as claimed in claim 1 wherein said reactors are magnetically coupled.

6. The inverter as claimed in claim 1, wherein one terminal of each of said voltage spike absorbing circuits is connected to a junction of respective ones of said series connected diodes.

7. The inverter as claimed in claim 6, wherein a second terminal of each of said voltage spike absorbing circuits is connected to a source terminal of a respective one of said field effect transistors.

8. The inverter as claimed in claim 1, wherein each of said current control elements comprises a bipolar transistor.

9. The inverter as claimed in claim 8, further comprising a diode connected across an emitter-collector circuit of each of said transistors.

10. The inverter as claimed in claim 1, wherein each of said current control elements comprises a device selected from the group consisting of a field effect transistor, an electrostatic induction transistor and a gate-turn-off thyristor.

11. The inverter as claimed in claim 1, wherein each of said voltage spike circuits comprises at least one of a diode and a zener diode.

* * * * *